(12) United States Patent
Yokoyama

(10) Patent No.: US 6,962,863 B2
(45) Date of Patent: Nov. 8, 2005

(54) SEMICONDUCTOR DEVICE HAVING INTERCONNECTION LAYER WITH MULTIPLY LAYERED SIDEWALL INSULATION FILM

(75) Inventor: Yuji Yokoyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/704,684

(22) Filed: Nov. 12, 2003

(65) Prior Publication Data

US 2004/0104485 A1 Jun. 3, 2004

Related U.S. Application Data

(62) Division of application No. 09/934,595, filed on Aug. 23, 2001, now Pat. No. 6,703,715.

(30) Foreign Application Priority Data

Mar. 30, 2001 (JP) .............................. 2001-100463

(51) Int. Cl.[7] ................. H01L 21/3205; H01L 21/4763
(52) U.S. Cl. ...................... 438/595; 438/597; 438/618; 438/675
(58) Field of Search ....................... 438/595, FOR 177, 438/FOR 193, FOR 212, 618, 597, 675

(56) References Cited

U.S. PATENT DOCUMENTS

| 4,868,617 | A | | 9/1989 | Chiao et al. |
|---|---|---|---|---|
| 5,182,619 | A | | 1/1993 | Pfiester |
| 5,221,632 | A | * | 6/1993 | Kurimoto et al. ........... 438/305 |
| 5,808,347 | A | | 9/1998 | Kurimoto et al. |
| 5,814,553 | A | * | 9/1998 | Chuang et al. .............. 438/595 |
| 5,918,125 | A | | 6/1999 | Guo et al. |
| 6,124,621 | A | | 9/2000 | Lin et al. |
| 6,207,519 | B1 | * | 3/2001 | Kim et al. ................... 438/303 |
| 6,291,354 | B1 | * | 9/2001 | Hsiao et al. ................. 438/701 |
| 6,323,519 | B1 | | 11/2001 | Gardner et al. |
| 6,326,270 | B1 | * | 12/2001 | Lee et al. .................... 438/279 |
| 6,420,250 | B1 | * | 7/2002 | Cho et al. .................... 438/595 |
| 6,506,655 | B1 | | 1/2003 | Gris et al. |
| 6,740,559 | B2 | * | 5/2004 | Higuchi ....................... 438/303 |

* cited by examiner

Primary Examiner—Michelle Estrada
(74) Attorney, Agent, or Firm—Westerman, Hattori, Daniels & Adrian, LLP

(57) ABSTRACT

The semiconductor device comprises an interconnection layer 14 formed on a substrate 10, a cap insulation film 22 formed on the upper surface of the interconnection layer 14, and a sidewall insulation film which is formed on the side walls of the interconnection layer 14 and the cap insulation film 22 and which includes a larger layer number of insulation films 24, 26 28 covering the side wall of the interconnection layer 14 at the side wall of the cap insulation film 22 than a layer number of insulation films 24, 26 at the side wall of the cap insulation film 22. Accordingly, the sidewall insulation film can be thickened at the side wall of the interconnection layer 14, whereby a parasitic capacitance between the interconnection layer 14 and the electrodes 32 adjacent to the interconnection layer 14 through the sidewall insulation film can be low.

3 Claims, 15 Drawing Sheets

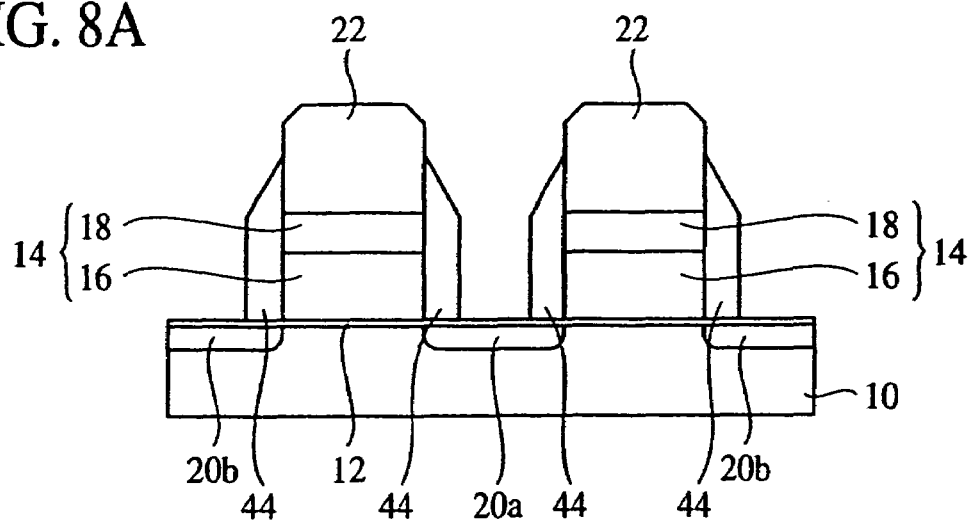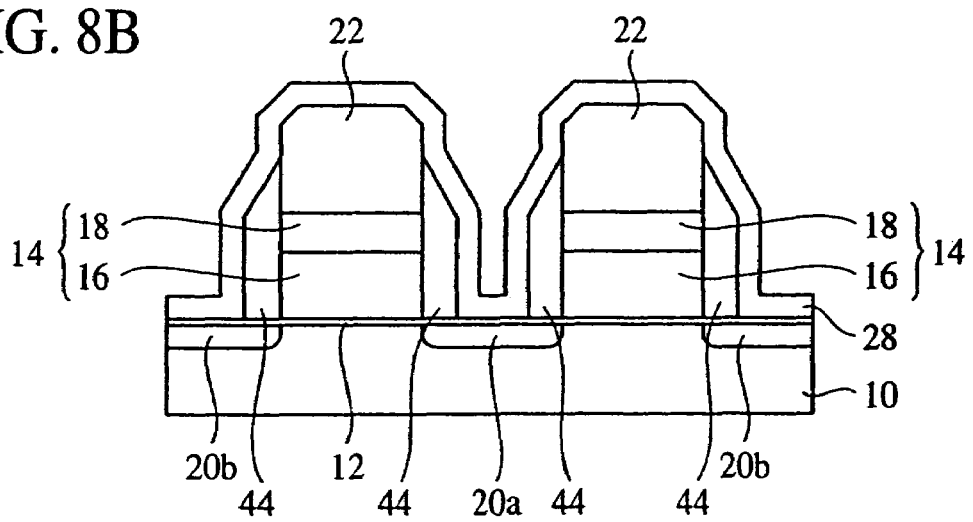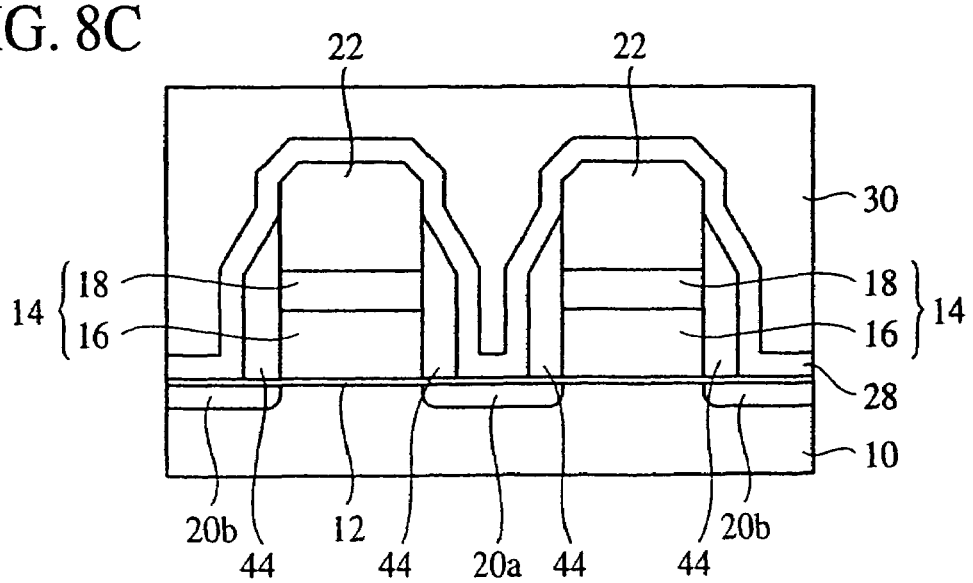

SEMICONDUCTOR DEVICE HAVING INTERCONNECTION LAYER WITH MULTIPLY LAYERED SIDEWALL INSULATION FILM

RELATED APPLICATION

This application is a divisional of U.S. patent application Ser. No. 09/934,595 filed on Aug. 23, 2001, now U.S. Pat. No. 6,703,715, which is hereby incorporated by reference in its entirety. Priority under 35 U.S.C. §§120 and 121 is hereby claimed for benefit of the filing date of U.S. patent application Ser. No. 09/934,595.

BACKGROUND OF THE INVENTION

The present invention relates to a semiconductor device and a method for fabricating the semiconductor device, more specifically to a semiconductor device including sidewall insulation films for interconnection layers, which are suitable to open micronized contact holes between the interconnection layers.

A DRAM (Dynamic Random Access Memory), which comprises memory cells each including one transfer transistor and one capacitor, may take a small area, and is a semiconductor memory suitable to be larger-scaled. As throughputs of electronic machines and instruments, etc. have been recently increased, DRAMs used in electronic machines and instruments have been rapidly micronized and larger-scaled.

Steps of a conventional DRAM fabrication method up to the step of forming bit contacts will be explained with reference to FIGS. 12 to 14. FIGS. 12 to 14 are sectional views of the DRAM in the steps of the method, which show the method. The views of FIGS. 12 to 14 are sectional views in the direction of a bit line.

First, a gate insulation film 102 of a silicon oxide film of, e.g., a 5 nm-thickness is formed on a silicon substrate 100 by, e.g., thermal oxidation.

Next, an amorphous silicon film 104 of, e.g., a 70 nm-thickness, a tungsten film 106 of, e.g., a 45 nm thickness, and a silicon nitride film 108 of, e.g., a 200 nm-thickness are sequentially deposited on the entire surface by, e.g., CVD (Chemical Vapor Deposition).

Next, these films are patterned in the same shape by lithography and etching. Thus, the gate electrode 112 having the upper surface covered by the silicon nitride film 108 and having the amorphous silicon film 104 and the tungsten film 106 laid one on the other is formed.

Next, with the gate electrode 112 as a mask, ion implantation is performed to form a source/drain diffused layer 114a, 114b in the silicon substrate 100 on both side of the gate electrode 20 (FIG. 12A).

Thus, a memory cell transistor including the gate electrode 112, the source/drain diffused layer 114a, 114b is formed on the silicon substrate 100.

Next, a silicon nitride film 116 of, e.g., a 20 nm-thickness is formed on the entire surface by, e.g., CVD (FIG. 12B).

Next, anisotropic etching is performed until the silicon substrate 100 is exposed to form a spacer insulation film 118 of the silicon nitride film on the side wall of the gate electrode 112 (FIG. 12C).

Then, a barrier insulation film 120 of a silicon nitride film of, e.g., a 15 nm-thickness is formed on the entire surface by, e.g., CVD (FIG. 13A).

Then, an inter-layer insulation film 122 of a BPSG (Boro-Phospho-Silicate Glass) of, e.g., an about 350 nm-thickness is formed on the entire surface by, e.g., CVD (FIG. 13B).

Next, a step of the inter-layer insulation film 122 on the upper surface thereof is decreased by, e.g., reflow, and then the upper surface of the inter-layer insulation film 122 is polished until the silicon nitride film 108 is exposed, to be planarized (FIG. 13C).

Next, a contact hole 124 is formed by lithography and etching down to the source/drain diffused layer 114a in the inter-layer insulation film 122 and the gate insulation film 102 by self-alignment with the gate electrode 112 and the barrier insulation film 120 (FIG. 14A).

Then, a plug of amorphous silicon is buried in the contact hole 124 opened in the inter-layer insulation film 122 (FIG. 14B). For example, an amorphous silicon film is deposited by, e.g., CVD and then etched back until the silicon nitride film 108 is exposed, to be thereby left selectively in the contact hole 124. Thus, the plug 126 is formed in the contact hole 124.

Next, inter-layer insulation films 128a, 128b are sequentially formed of, e.g., silicon oxide film, etc. on the entire surface by, e.g., CVD.

Next, a contact hole 130 is formed down to the plug 126 in the inter-layer insulation films 128a, 128b by lithography and etching.

Then, a bit line 132 is formed on the inter-layer insulation film 128b, connected to the plug 126 through the contact hole 130 (FIG. 14C).

As described above, in the conventional DRAM fabrication method, the so-called self-alignment contact technique that the silicon nitride film 108 formed on the gate electrode 112, and the spacer insulation film 118 and the barrier insulation film 120 formed on the side wall of the gate electrode 112 are used as a stopper in opening the contact hole 120 has been widely used. Such self-alignment contact technique is widely used in fabricating not only DRAMs but also other memory devices, such as SRAMs, logistic devices, etc.

However, the sidewall insulation film formed of the space insulation film 118 and the barrier insulation film 120 on the side wall of the gate electrode have been becoming thinner with recent more micronization of semiconductor devices for higher integration. Such thinning of the sidewall insulation film causes capacitance increase between interconnection layers and between interconnection layers and plugs. Even in a case that a metal material of low resistivity is used as a material forming the gate electrode, signal delay due to such parasitic capacitances have spoiled the merits of such metal material.

It will be means for solving the above-described problem to make the sidewall insulation film as thick as possible in forming the sidewall insulation film. However, the sidewall insulation film is simply made thick, whereby a gap between adjacent sidewall insulation film is made small, which makes it difficult to form the contact hole between the layers. That is, when the sidewall insulation film is made thick, a gap 134 between the barrier insulation film 120 is made small as exemplified in FIG. 15. Such small gap 134 does not admit a reactive gas for the etching to remove the barrier insulation film 120 at the bottom of the gap 134 so as to form the contact hole to arrive at the side wall of the gap 134. As a result, it is difficult to form the contact hole.

When the gap 134 is small, a contact area where the plug 126 and the bit line 130 contact each other is made small, which results in contact resistance increase.

Furthermore, at actual fabrication sites, it is necessary to ensure margins for fabrication deflections. Accordingly, the gap 134 will be made smaller.

SUMMARY OF THE INVENTION

An object of the present invention is to provide a semiconductor device whose parasitic capacitance between interconnection layers is small and which includes a sidewall insulation film between the interconnection layers, which is easy for contact holes to be formed, and a method for fabricating the semiconductor device.

The above-described object is achieved by a semiconductor device comprising: an interconnection layer formed above a substrate; a cap insulation film formed above the upper surface of the interconnection layer; and a sidewall insulation film which is formed on side walls of the interconnection layer and the cap insulation film, which includes at least 3 or more layers of insulation films, and which has a larger layer number at the side wall of the interconnection layer than at the side wall of the cap insulation film.

The above-described object is also achieved by a semiconductor device comprising: an interconnection layer formed above a substrate; a cap insulation film formed above the upper surface of the interconnection layer; and a sidewall insulation film which is formed on side walls of the interconnection layer and the cap insulation film, which includes at least 3 or more layers of insulation films at least one of which has a dielectric constant different from those of the others, and which is thicker at the side wall of the interconnection layer than at the side wall of the cap insulation film.

The above-described object is also achieved by a semiconductor device comprising: an interconnection layer formed above a substrate; a cap insulation film formed above the upper surface of the interconnection layer; and a sidewall insulation film which is formed on side walls of the interconnection layer and the cap insulation film, which includes a first insulation film having a height substantially equal to that of the cap insulation film and a second insulation film having a height equal to that of at least the interconnection layer, and which is thicker at the side wall of the interconnection layer than at the side wall of the cap insulation film.

In the above-described semiconductor device it is possible that the sidewall insulation film includes a first insulation film provided on the side walls of the interconnection layer and the cap insulation film, a second insulation film provided on a lower region of the side wall of the first insulation film, and a third insulation film provided on an upper region of the side wall of the first insulation film and the side wall of the second insulation film.

In the above-described semiconductor device it is possible that the sidewall insulation film includes a first insulation film provided on the side walls of the interconnection layer and the cap insulation film, a second insulation film provided on a side wall of the first insulation film and being thicker in a lower region than in an upper region, and a third insulation film provided on a side wall of the second insulation film.

In the above-described semiconductor device it is possible that the first insulation film is provided on the side walls of the interconnection layer and the cap insulation film, and the second insulation film is provided on the lower region of the side wall of the first insulation film.

In the above-described semiconductor device it is possible that the second insulation film is provided on the side wall of the interconnection layer, and the first insulation film is provided on the side wall of the second insulation film and the side wall of the cap insulation film.

In the above-described semiconductor device it is possible that the second insulation film has an upper surface declined so as to be lower as spaced from the interconnection layer.

In the above-described semiconductor device it is possible that the sidewall insulation film further includes a fourth insulation film formed on a part of the side wall of the interconnection layer.

The above-described object is also achieved by a method for fabricating a semiconductor device comprising the steps of: forming above a substrate an interconnection layer having an upper surface covered by a cap insulation film; forming a first insulation film on the substrate with the cap insulation film and the interconnection layer formed on; forming a second insulation film whose etching rate is higher than that of the first insulation film on the first insulation film; anisotropically etching the second insulation film and the first insulation film to leave the first insulation film selectively on side walls of the interconnection layer and the cap insulation film and leave the second insulation film selectively on a lower region of a side wall of the first insulation film; and forming a third insulation film on an upper region of the side wall of the first insulation film and a side wall of the second insulation film.

The above-described object is also achieved by a method for fabricating a semiconductor device comprising the steps of: forming above a substrate an interconnection layer having an upper surface covered by a cap insulation film; forming a first insulation film on the substrate with the cap insulation film and the interconnection layer formed on; forming a second insulation film whose etching rate is higher than that of the first insulation film on the first insulation film; anisotropically etching the second insulation film and the first insulation film to leave the first insulation film selectively on side walls of the interconnection layer and the cap insulation film and thin the second insulation film selectively in an upper region of a side wall of the first insulation film; and forming a third insulation film on an upper region of the side wall of the first insulation film and a side wall of the second insulation film.

In the above-described method for fabricating a semiconductor device, it is possible that the method further comprises the steps of: forming a fourth insulation film; anisotropically etching the fourth insulation film and the third insulation film with the cap insulation film and the first to the third insulation films as a stopper to form a contact hole down to the substrate in the fourth insulation film and the third insulation film.

In the above-described method for fabricating a semiconductor device, it is possible that the method further comprises the step of: removing the third insulation film in the contact hole after the step of forming a contact hole.

The above-described object is also achieved by a method for fabricating a semiconductor device comprising the steps of: forming above a substrate an interconnection layer having an upper surface covered by a cap insulation film; forming a first insulation film on the substrate with the cap insulation film and the interconnection layer formed on; anisotropically etching the first insulation film to leave the first insulation film selectively on a side wall of the interconnection layer while exposing at least a part of a side wall of the cap insulation film; and forming a second insulation film on a side wall of the first insulation film and a side wall of the cap insulation film.

In the specification, a "substrate" means a semiconductor substrate itself, such as a silicon substrate or others, and also a semiconductor substrate with transistors, interconnection layers, insulation films or others, formed on.

As described above, according to the present invention, a sidewall insulation film is formed on the side walls of an interconnection layer and a cap insulation layer covering the upper surface of the interconnection layer, and the sidewall insulation film has a larger layer number of layers of insulation films at the side wall of the interconnection layer than at the side wall of the cap insulation film, so as to be thicker selectively at the side wall of the interconnection layer, whereby a parasitic capacitance between the interconnection layer and the electrode adjacent to the interconnection layer through the sidewall insulation film can be very small. The sidewall insulation film is thinner at the side wall of the cap insulation film than at the side wall of the interconnection layer, which facilitates etching for forming a contact hole in the interconnection layer.

The sidewall insulation film is formed of two or more insulation films having dielectric constants different from each other. A first insulation film is of lower dielectric constant and functions to selectively thicken the sidewall insulation film at the side wall of the interconnection layer and to lower parasitic capacitance, whereby even in a case that another insulation film is a barrier insulation film of high dielectric constant, a parasitic capacitance between the interconnection layer and electrodes adjacent to the interconnection layer through the sidewall insulation film can be very low.

BRIEF DESCRIPTION OF THE DRAWINGS

FIGS. 8A–8C are sectional views of the semiconductor device according to the second embodiment of the present invention in the steps of the method for fabricating the semiconductor device, which show the method (Part 2).

DETAILED DESCRIPTION OF THE INVENTION

[A First Embodiment]

Figure 1:
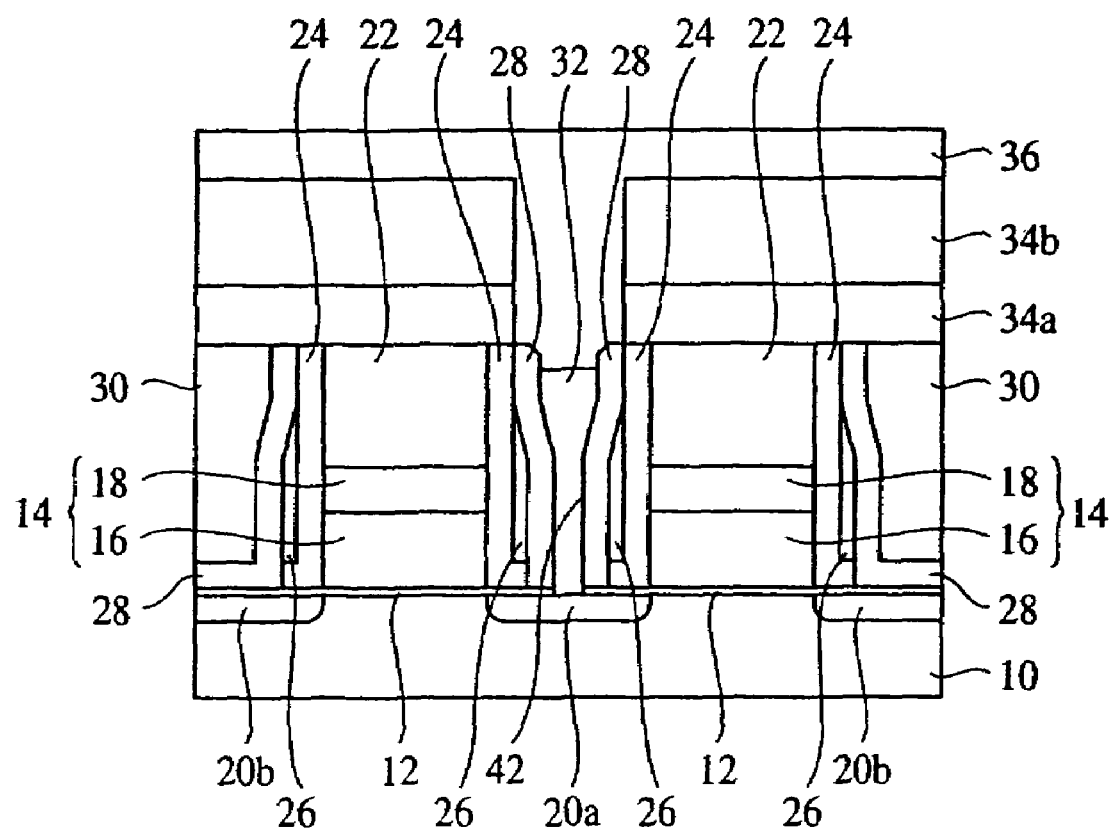
FIG. 1 is a diagrammatic sectional view of the semiconductor device according to a first embodiment of the present invention.

The semiconductor device according to a first embodiment of the present invention and the method for fabricating the semiconductor device will be explained with reference t FIGS. 1, 2A–2C, 3A–3C, and 4A–4C. FIG. 1 is a diagrammatic sectional view of the semiconductor device according to the present embodiment, which show a configuration thereof. FIGS. 2A–2C, 3A–3C, and 4A–4C are sectional views of the semiconductor device in the steps of the method for fabricating the semiconductor device, which show the method.

First, the configuration of the semiconductor device according to the first embodiment will be explained with reference to FIG. 1.

A gate insulation film 12 of a silicon oxide film is formed on a silicon substrate 10. A gate electrode 14 is formed on the gate insulation film 12 with the upper surface covered by a cap insulation film 22 of a silicon nitride film. The gate electrode 14 has a layer structure of an amorphous silicon film 16 and a tungsten film 18. Source/drain diffused layers 20a, 20b are formed in the silicon substrate 10 on both sides of the gate electrode 14. Thus, a memory cell transistor including the gate electrode 14 and the source/drain diffused layers 20a, 20b is constituted.

A spacer film 24 is formed of a silicon nitride film on the side surfaces of the gate electrode 14 and the cap insulation film 22. A lower spacer insulation film 26 is formed on the side wall of the spacer insulation film 24, selectively covering a lower region of the side surface. A barrier insulation film 28 of a silicon nitride film is formed on the side surface of the lower spacer insulation film 26 and the side surface of a region of the spacer insulation film, which is not covered by the lower spacer insulation film.

An inter-layer insulation film 30 of BPSG having substantially the same height as the cap insulation film 22 is buried around the gate electrode 14, making the surface planarized. A contact hole 42 is formed in the inter-layer insulation film 30 down to the source/drain diffused layer 20a. A plug 32 is buried in the contact hole 42, electrically connected to the source/drain diffused layer 20a. Inter-layer insulation films 34a, 34b are formed of silicon oxide film, etc. on the cap insulation film 22 and the inter-layer insulation film 30. A bit line 36 is formed on the inter-layer insulation film 34b, electrically connected to the source/drain diffused layer 20a through the plug 32 buried in the inter-layer insulation film 30.

As described above, the semiconductor device according to the present embodiment is characterized mainly in that the sidewall insulation film covering the side surface of the gate electrode 14 is formed of the spacer insulation film 24, the lower spacer insulation film 26 and the barrier insulation film 28. The sidewall insulation film is thus formed, whereby the sidewall insulation film can be made thicker selectively near the gate electrode 14 to thereby decrease a parasitic capacitance between the gate electrode 14 and the plug 32. The lower spacer insulation film 26 is formed of silicon oxynitride film, whose dielectric is lower than silicon nitride film, whereby the parasitic capacitance can be further decreased. Etching gas can be easily admitted between the gate electrodes 14, whereby the etching for forming the contact hole 42 can be easily. The upper surface of the plug 32 can have a large area, whereby a large margin can be allowed for the connection with upper interconnection with the bit line 36, etc.

It is preferable that the lower spacer insulation film 26 has substantially the same height as at least the gate electrode 14. Purposes of forming the lower spacer insulation film 26 are to decrease a parasitic capacitance between the gate electrode 14 and the plug 32, and to prevent the exposure of the gate electrode in the contact hole when the contact hole is formed. Accordingly, it is preferable that a height of the lower spacer insulation film 26 is controlled in consideration of these points and corresponding to etching conditions and design rules of the inter-layer insulation films in forming the contact hole 42.

Next, the method for fabricating the semiconductor device according to the present embodiment will be explained with reference to FIGS. 2A–2C, 3A–3C, and 4A–4C. FIGS. 2A–2C, 3A–3C, and 4A–4C are sectional views along a bit line of the DRAM.

First, the gate insulation film 12 is formed of a silicon oxide film of, e.g., a 5 nm-thickness on a silicon substrate 10 by, e.g., thermal oxidation.

Next, the amorphous silicon film 16 of, e.g., a 70 nm-thickness, the tungsten film 18 of, e.g., 45 nm-thickness and the cap insulation film 22 of a silicon nitride film of, e.g., a 200 nm-thickness are sequentially deposited on the entire surface by, e.g., CVD.

Then, these films are patterned in the same shape by lithography and etching. Thus, the gate electrode 14 having the upper surface covered by the cap insulation film 22 and formed of the amorphous silicon film 16 and the tungsten film 18 laid on each other is formed. At this time, a 0.13 $\mu$m-rule is assumed to form a plurality of the gate electrodes 14 of a 0.13 $\mu$m-width at a pitch of, e.g., 0.13 $\mu$m.

Strictly, the amorphous silicon film 16 of the gate electrode 14 is crystallized in a later thermal step to be a polycrystal silicon film. However, in the present specification, the polycrystal silicon film will be called the amorphous silicon film in the following description for the convenience of the explanation.

Figure 2A:
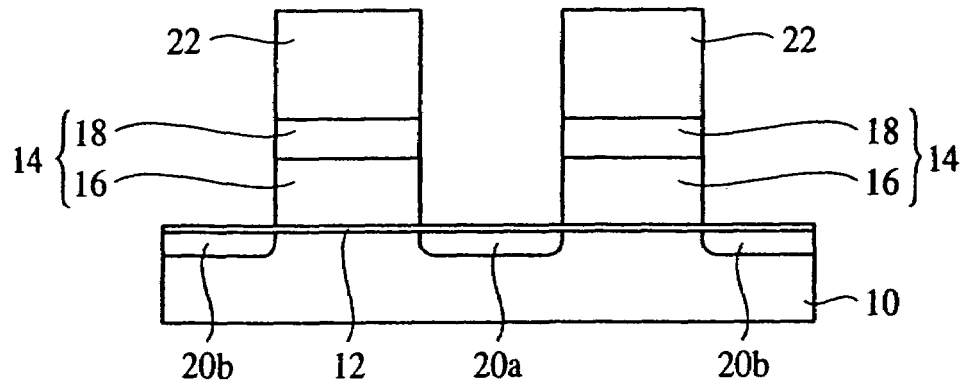
FIGS. 2A–2C are sectional views of the semiconductor device according to the first embodiment of the present invention in the steps of the method for fabricating the semiconductor device, which explain the method (Part 1).

Next, with the gate electrode 14 as a mask, ion implantation is performed to form the source/drain diffused layers 20a, 20b in the silicon substrate 10 on both sides of the gate electrode 14 (FIG. 2A).

Thus, on the silicon substrate 10, a memory cell transistor including the gate electrode 14 and the source/drain diffused layers 20a, 20b is formed.

Figure 2B:
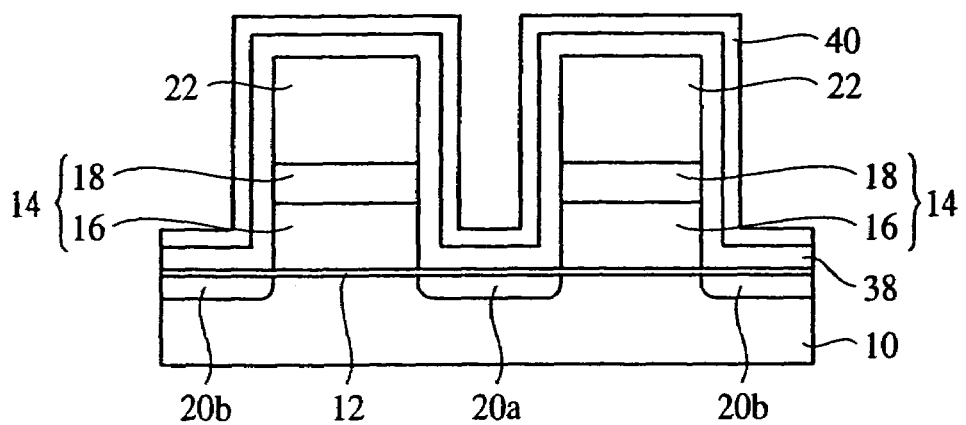

Then, the silicon nitride film 38 of, e.g., a 20 nm-thickness and the silicon oxynitride film 40 of, e.g., a 10 nm-thickness are sequentially formed on the entire surface by, e.g., CVD (FIG. 2B).

The silicon nitride film 38 and the silicon oxynitride film 40 are to be the spacer insulation film 24 and the lower spacer insulation film 26. These insulation films are not limited to silicon nitride film and silicon oxynitride film and can be other insulation materials as long as a combination of insulation films makes an etching rate of the upper layer than that of the lower layer. For example, in place of silicon oxynitride film, silicon oxide film can be used.

The silicon nitride film 38 and the silicon oxynitride film 40 may be formed in different furnaces or may be continuously grown in one and the same furnace. The continuous growth makes the interface between the silicon nitride film 38 and the silicon oxynitride film 40 clean and can decrease a number of fabrication steps.

Figure 2C:
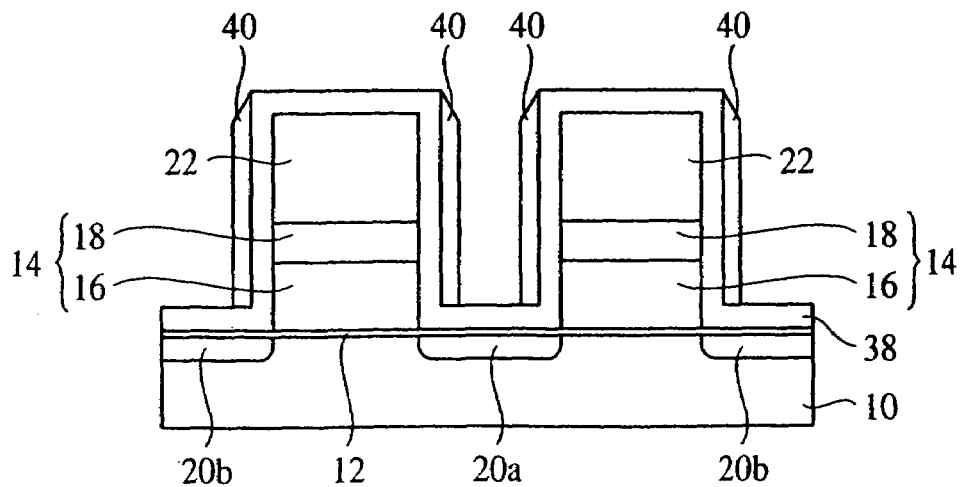

Next, the silicon oxynitride film 40 is anisotropically etched by, e.g., RIE (Reactive Ion Etching) selectively with respect to the silicon nitride film 38. Thus, the silicon oxynitride film 40 is left selectively only on the side wall of the silicon nitride film 38 (FIG. 2C).

The silicon oxynitride film 40 is anisotropically etched by RIE to have the upper surface declined as spaced from the gate electrode 14.

Next, the silicon nitride film 38 is anisotropically etched by, e.g., RIE until the surface of the cap insulation film 22 is exposed. At this time, as conditions for etching the silicon nitride film 38, conditions which make an etching rate of the silicon oxynitride film 40 higher than that of the silicon nitride film 38 are used, whereby the silicon nitride film 38 on the cap insulation film 22 and the gate insulation film 12 is etched while the upper edge of the silicon oxynitride film 40 being etched.

The silicon oxynitride film 40 and the silicon nitride film 38 may be separately etched under different conditions or may be continuously etched under the same conditions.

Figure 3A:
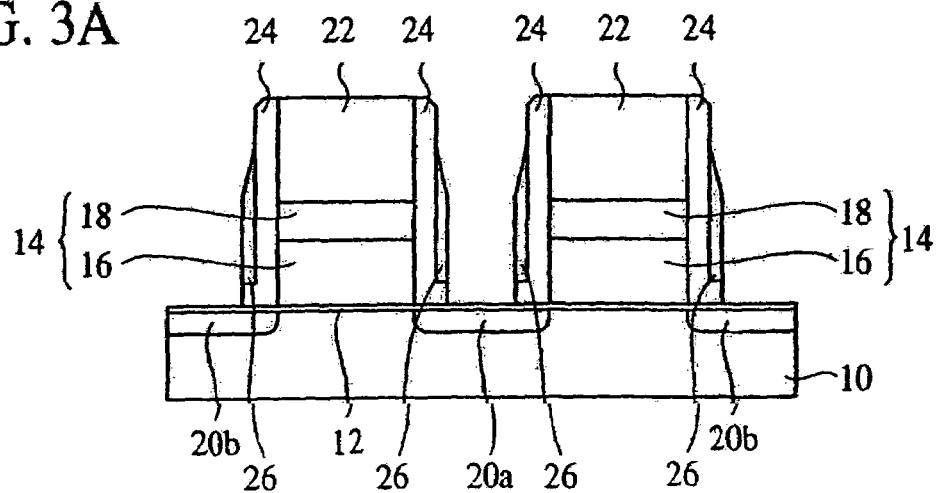
FIGS. 3A–3C are sectional views of the semiconductor device according to the first embodiment of the present invention in the steps of the method for fabricating the semiconductor device, which explain the method (Part 2).

Thus, the spacer insulation film 24 of the silicon nitride film 38 and the lower spacer insulation film 26 of the silicon oxynitride film 40 are formed on the side walls of the gate electrode 14 and the cap insulation film 22 (FIG. 3A). Preferably, as described above, the lower spacer insulation film 26 has a height substantially equal to that of at least the gate electrode 14.

The lower spacer insulation film 26 covering the side wall near the gate electrode 14 is formed by utilizing an etching rate difference as described above, so as to thicken the sidewall insulation film, whereby the sidewall insulation film near the gate electrode 14 can be selectively thickened without deceasing a width of a gap between the gate electrodes at the top of the gap. Accordingly, a parasitic capacitance generated between the gate electrode 14 and the plug 32 can be small without making it difficult to form the contact hole 42. A material of the lower spacer insulation film 26 may be of a lower dielectric constant than materials of the spacer insulation film 24 and the barrier insulation film 28, whereby a parasitic capacitance between the gate electrode 14 and the plug 32 can be further smaller.

Figure 3B:
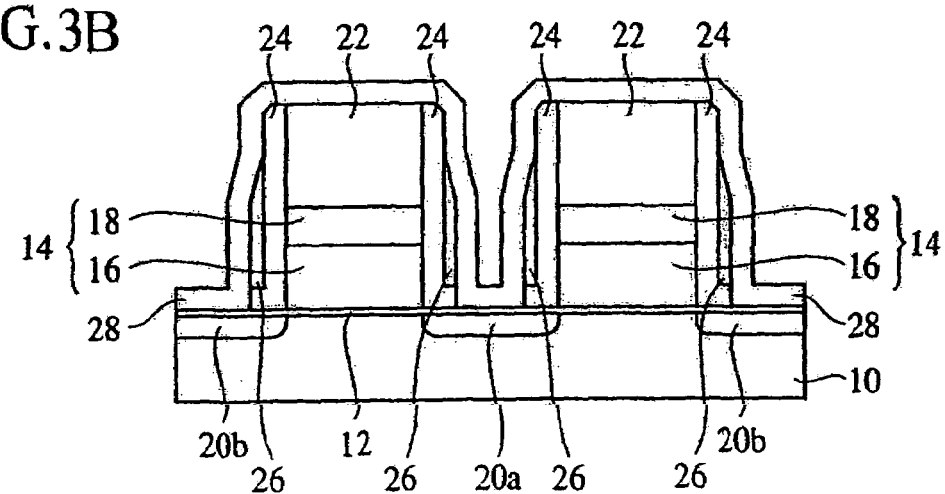

Then, a silicon nitride film of, e.g., a 15 nm-thickness is deposited on the entire surface by, e.g., CVD for form the barrier insulation film 28 of the silicon nitride film (FIG. 3B). Preferably, the barrier insulation film 28 is formed of the same material as the cap insulation film 22 and the spacer insulation film 24 or is formed of a material whose etching rate is substantially the same as that of the cap insulation film 22 and the spacer insulation film 24. Thus, the contact hole 42 in which the plug 32 to be connected to the source/drain diffused layer 20a in a later fabrication step is to be buried can be formed by self-alignment contact.

Figure 3C:
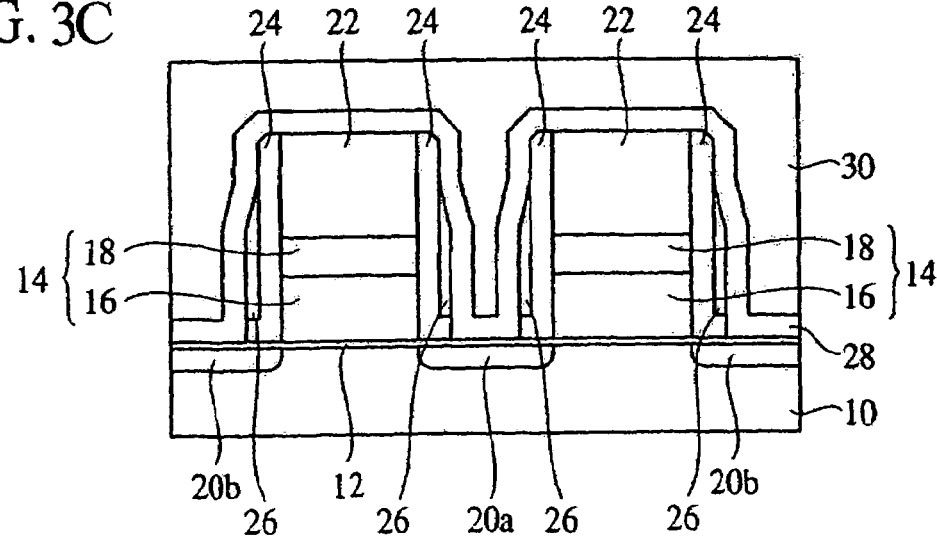
Figure 4A:
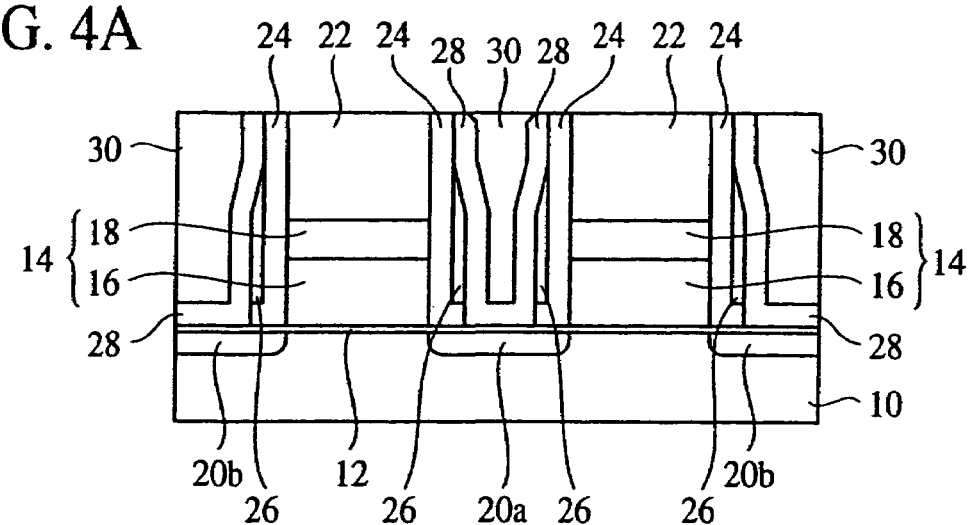
FIGS. 4A–4C are sectional views of the semiconductor device according to the first embodiment of the present invention in the steps of the method for fabricating the semiconductor device, which explain the method (Part 3).

Next, the inter-layer insulation film 30 formed of a BPSG film of, e.g., an about 350 nm-thickness is formed on the entire surface by, e.g., CVD (FIG. 3C). A surface step of the inter-layer insulation film 30 is mitigated by, e.g., reflow, and then the surface is polished by, e.g., CMP until the cap insulation film 22 is exposed, so as to planarize the surface of the inter-layer insulation film 30 (FIG. 4A).

Figure 4B:
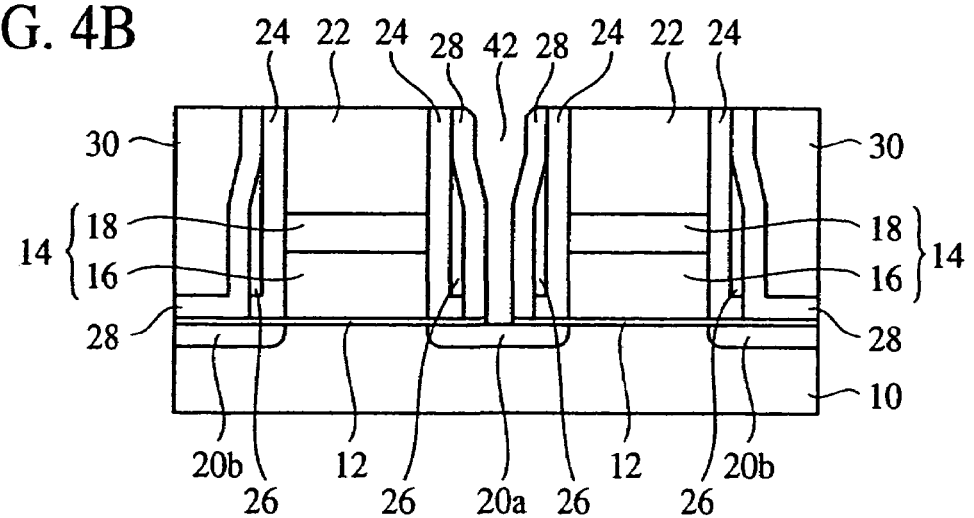

Then, a contact hole 42 is formed in the inter-layer insulation film 30 down to the source/drain diffused layer 20a by lithography and etching by self-alignment with the gate electrode 14 and the barrier insulation film 28 (FIG. 4B). At this time, a gap at the upper end of the sidewall insulation film is wider than that at the bottom, which easily admits an etching gas in the gap between the sidewall insulation film, and accordingly the contact hole 42 can be easily opened.

Figure 4C:
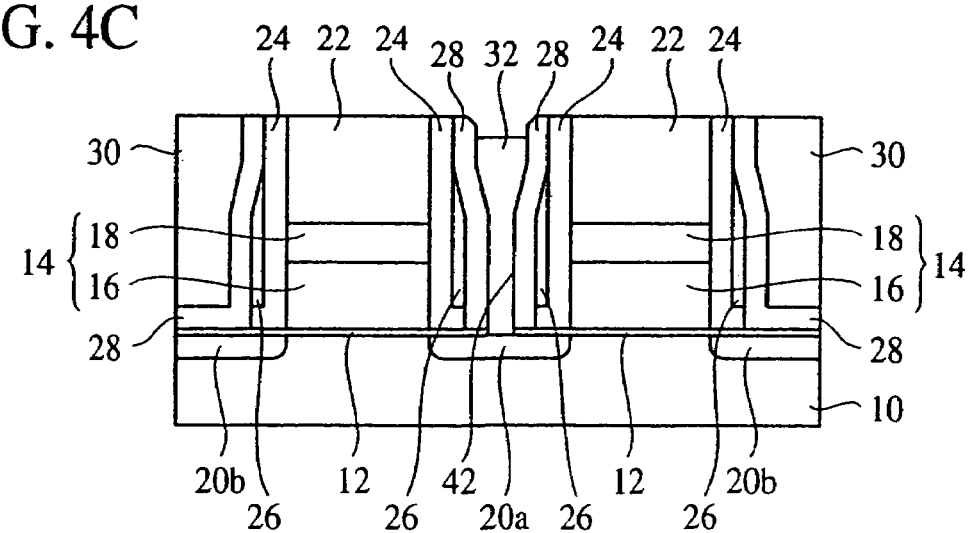

Then, the plug 32 of, e.g., amorphous silicon is buried in the contact hole 42 opened in the inter-layer insulation film 30 (FIG. 4C). The amorphous silicon film is deposited by, e.g., CVD, and is etched back until the cap insulation film 22 is exposed to leave the amorphous silicon film selectively in the contact hole 42. Thus, the plug 32 is formed in the contact hole 42.

Next, a silicon oxide film, for example is deposited on the entire surface by, e.g., CVD to form the inter-layer insulation films 34a, 34b of the silicon oxide film.

Then, a contact hole is formed by lithography and etching down to the plug 32 in the inter-layer insulation films 34a, 34b.

Then, interconnection layer (e.g., a bit line 36) is connected on the inter-layer insulation film 34b, electrically connected to the plug 32 through the contact hole. Thus, the semiconductor device according to the present embodiment having the configuration shown in FIG. 1 is fabricated.

As described above, according to the present embodiment, the sidewall insulation film covering the side walls of the gate electrode 14 and the cap insulation film 22 is thickened selectively at the lower region by the lower spacer insulation film 26, whereby a parasitic capacitance generated between the gate electrode 14 and the plug 32 can be small. The lower spacer insulation film 26 is formed of silicon oxynitride film, whose dielectric constant is lower than the silicon nitride film forming the spacer insulation film 24 and the barrier insulation film 28, whereby the parasitic capacitance can be further low.

A gap between the sidewall insulation film has a wider width on the side of the cap insulation film 22 than on the side of the gate electrode 14. Accordingly, the contact hole 42 for the plug 32 to be buried in can be easily formed. A large margin can be allowed for upper interconnection layers, such as the bit line 36, etc. The sidewall insulation film on the side of the cap insulation film 22 is decreased, whereby a contact resistance cannot be high.

Figure 5:
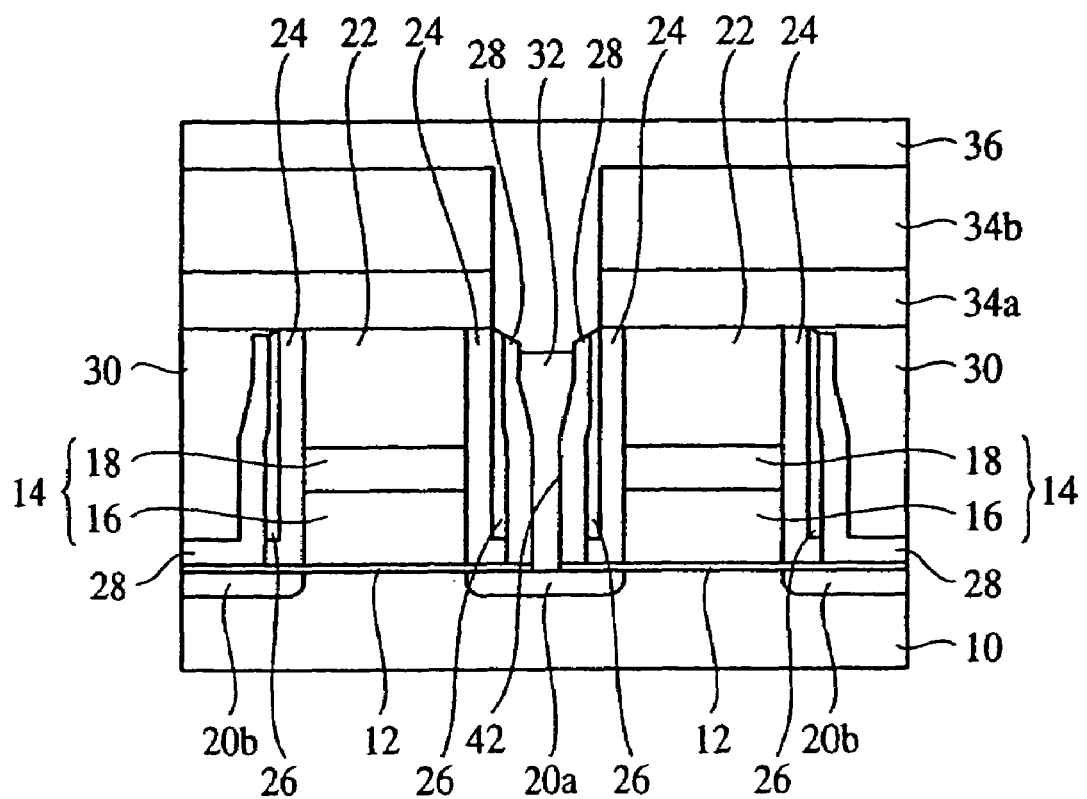
FIG. 5 is a diagrammatic sectional view of a modification of the semiconductor device according to the first embodiment of the present invention, which shows a configuration of the modification.

In the present embodiment, the lower spacer insulation film 26 is formed, covering selectively only a lower region of the side of the spacer insulation film 24. However, as exemplified in FIG. 5, the lower spacer insulation film 26 may be formed, extended up to the upper end of the spacer insulation film 24, and in this case it is necessary that the part of the lower spacer insulation film 26 covering the upper side wall of the cap insulation film 22 has a thickness smaller than a thickness of the part of the lower spacer insulation film 26 covering the side wall of the gate electrode 14.

A ratio between a film thickness of the part of the lower spacer insulation film 26 covering the upper side wall of the cap insulation film 22 and a film thickness of the part of the lower spacer insulation film 26 covering the side wall of the gate electrode 14 is preferably set in accordance with an aspect ratio of the contact hole 42 suitably in a range where the contact hole 42 can be opened. By using the RIE apparatus, the inventors of the present application could open the contact hole 42 by setting a film thickness of a part of the lower spacer insulation film 26 covering the upper part of the side wall of the cap insulation film 22 to be below 75% of a film thickness of a part of the lower spacer insulation film 26 covering the side wall of the gate electrode 14.

[A Second Embodiment]

The semiconductor device according to a second embodiment of the present invention and a method for fabricating the semiconductor device will be explained with reference to FIGS. 6, 7A–7C, 8A–8C, and 9A–9C. The same members of the present embodiment as those of the semiconductor device according to the first embodiment are represented by the same reference numbers not to repeat or to simplify their explanation.

First, a configuration of the semiconductor device according to the present embodiment will be explained with reference to FIG. 6.

The semiconductor device according to the present embodiment is characterized mainly in that the semiconductor device according to the first embodiment does not have the spacer insulation film and has the sidewall insulation film formed only of the lower spacer insulation film and the barrier insulation film.

Figure 6:
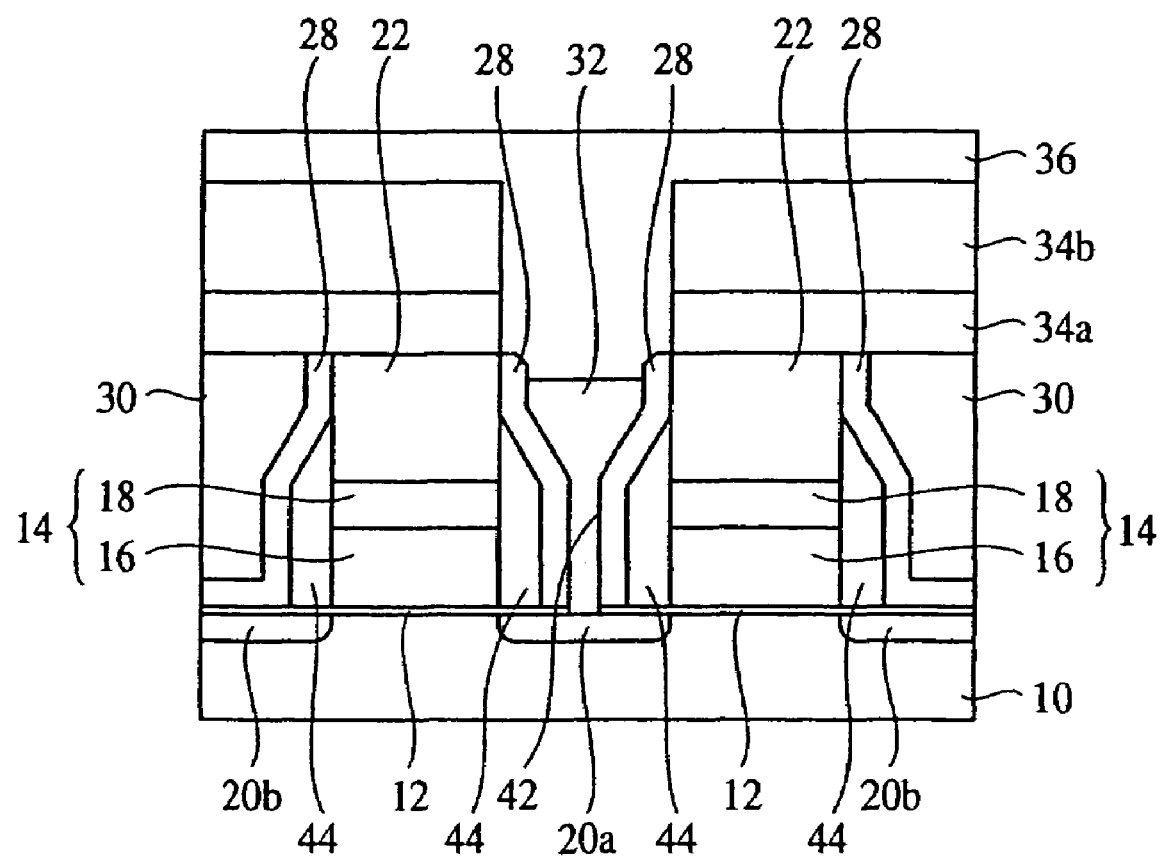
FIG. 6 is a diagrammatic sectional view of the semiconductor device according to a second embodiment of the present invention, which shows a configuration of the semiconductor device.

That is, as shown in FIG. 6, a lower spacer insulation film 44 of a silicon oxynitride film is formed on the side walls of a gate electrode 14 and a cap insulation film 22, covering selectively a lower region of the side wall. A barrier insulation film 28 of a silicon nitride film is formed on the side wall of the lower spacer insulation film 44 and the side wall of the cap insulation film 22 in a region where the cap insulation film 22 is not covered by the lower spacer insulation film 44.

Thus, in the present embodiment as well, the sidewall insulation film can be made thickened selectively near the gate electrode. The lower spacer insulation film 44 is formed of silicon oxide film, whose dielectric constant is lower than that of silicon nitride film, whereby a parasitic capacitance can be further low. An etching gas can be easily admitted inbetween the gate electrodes 14, which facilitates the etching for forming a contact hole 42. The upper surface of the plug can have a large area, which allows for a margin for the connection to upper interconnections, such as a bit line 36, etc.

It is preferable that the lower spacer insulation film 44 has a height substantially equal to that of at least the gate electrode 14, as has the lower spacer insulation film 28.

Then, the method for fabricating the semiconductor device according to the present embodiment will be explained with reference to FIGS. 7A–7C, 8A–8C, and 9A–9C. The views of FIGS. 7A–7C, 8A–8C, and 9A–9C are sectional views of a DRAM along the bit line in the steps of the method for fabricating the DRAM.

Figure 7A:
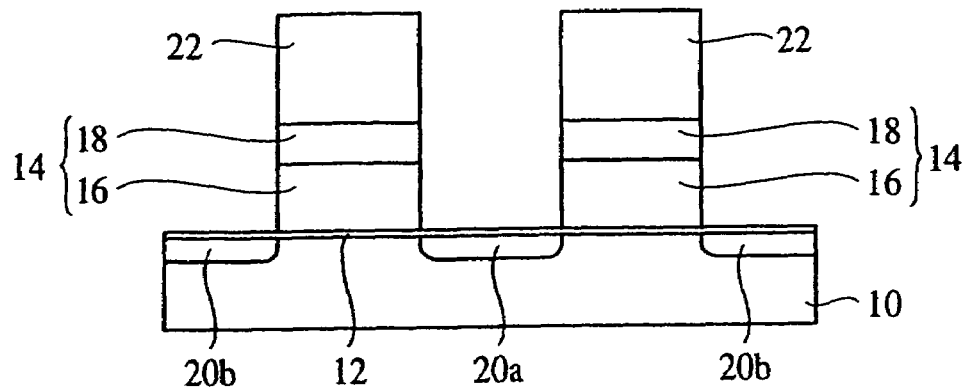
FIGS. 7A–7C are sectional views of the semiconductor device according to the second embodiment of the present invention in the steps of the method for fabricating the semiconductor device, which show the method (Part 1).

First, in the same way as in, e.g., the first embodiment, a memory cell transistor including the gate electrode 14 and a source/drain diffused layers 20a, 20b are formed on a silicon substrate 10 (FIG. 7A).

Figure 7B:
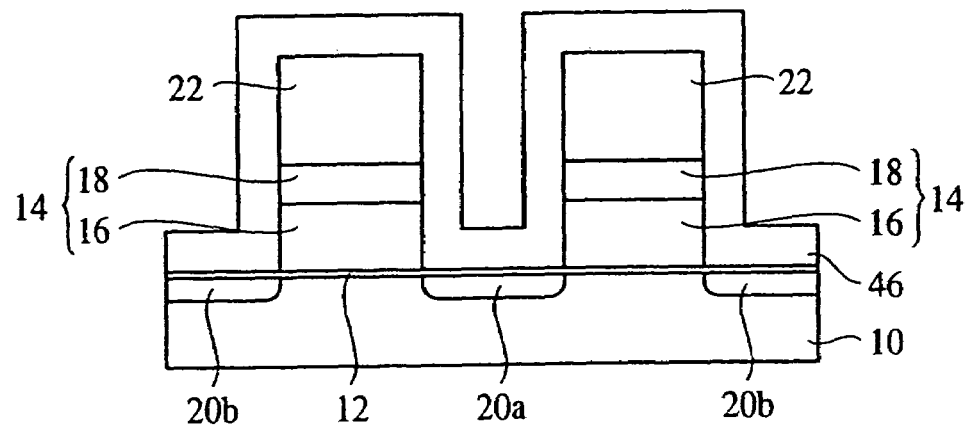

Next, a silicon oxynitride film 46 of, e.g., 30 nm-thickness is formed on the entire surface by, e.g., CVD (FIG. 7B). The silicon oxynitride film 46 is to be the lower spacer insulation film 44. A material forming the lower spacer insulation film 44 may be an insulation film having a higher etching rate than the cap insulation film 22, and silicon oxide film, for example, can be used in place of silicon oxynitride film.

Figure 7C:
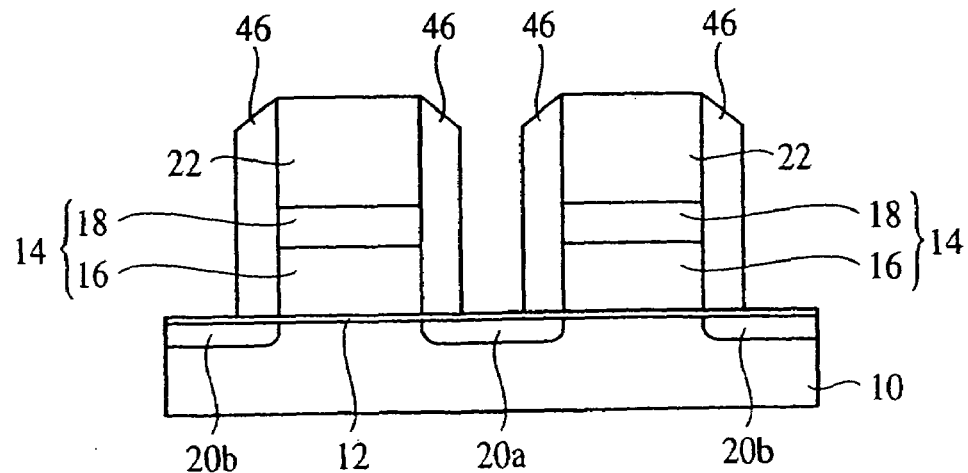

Next, the silicon oxynitride film 46 is anisotropically etched by, e.g., RIE selectively with respect to the gate electrode 14 and the cap insulation film 22. Thus, the silicon oxynitride film 46 is left selectively on the side walls of the gate electrode 14 ad the cap insulation film 22 (FIG. 7C).

The silicon oxynitride film 46 is anisotropically etched by RIE, whereby the upper surface of the silicon oxynitride film 46 is declined as spaced from the gate electrode 14.

Next, the silicon oxynitride film 46 remaining on the side walls of the gate electrode 14 and the cap insulation film 22 is further anisotropically etched by, e.g., RIE. At this time, conditions for etching the silicon oxynitride film 46 are for higher selectivity for the cap insulation film 22, whereby the upper edge of the silicon oxynitride film 46 can be etched although the upper edge of the cap insulation film 22 is often slightly etched. Thus, the lower spacer insulation film 44 of the silicon oxynitride film 46 is formed on the side walls of the gate electrode 14 and the cap insulation film 22 (FIG. 8A).

It is preferable that a height of the remaining lower spacer insulation film 44 is substantially equal to a height of at least the gate electrode 14, as is in the first embodiment.

As described above, the lower spacer insulation film 44 covering the side wall near the gate electrode 14 is formed by utilizing an etching rate difference to thereby thicken the side wall insulation film, whereby the sidewall insulation film near the gate electrode 14 can be selectively thickened without decreasing a width of the upper part of the gap between adjacent sidewall insulation film. Accordingly, a parasitic capacitance generated between the gate electrode 14 and the plug 32 can be low without making the formation of the contact hole 42 difficult. A material of the lower spacer insulation 44 can have a lower dielectric constant than a material of the barrier insulation film 28, whereby a parasitic capacitance between the gate electrode 14 and the plug 32 can be further low.

Next, the barrier insulation film 28 of a silicon nitride film of, e.g., a 15 nm-thickness is formed on the entire surface by, e.g., CVD (FIG. 8B).

Then, the inter-layer insulation film 30 of a BPSG film of, e.g., an about 350 nm-thickness is formed on the entire surface by, e.g., CVD (FIG. 8C). Then, the surface step of the inter-layer insulation film 30 is mitigated by, e.g., reflow, and then the surface is polished by, e.g., CMP until the cap insulation film 22 is exposed to planarize the surface of the inter-layer insulation film 30.

Figure 9A:
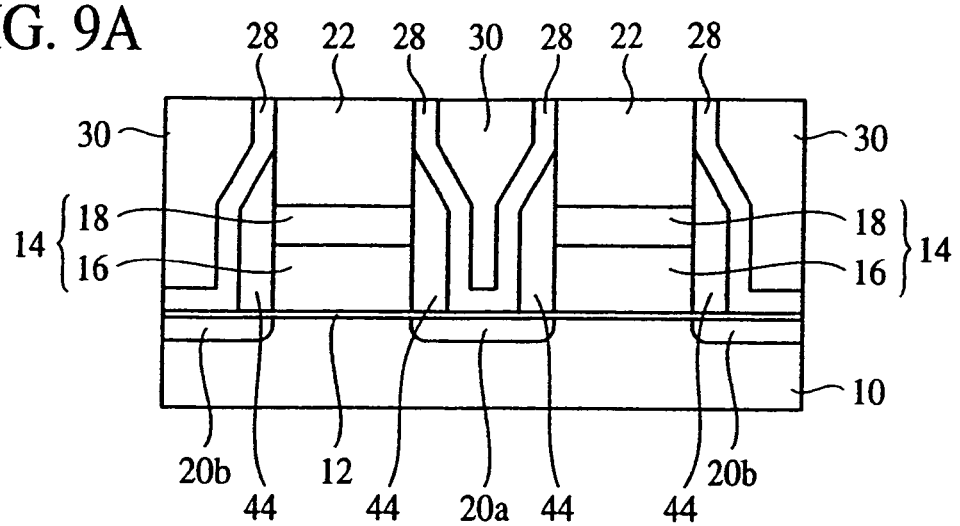
FIGS. 9A–9C are sectional views of the semiconductor device according to the second embodiment of the present invention in the steps of the method for fabricating the semiconductor device, which show the method (Part 3).
Figure 9B:
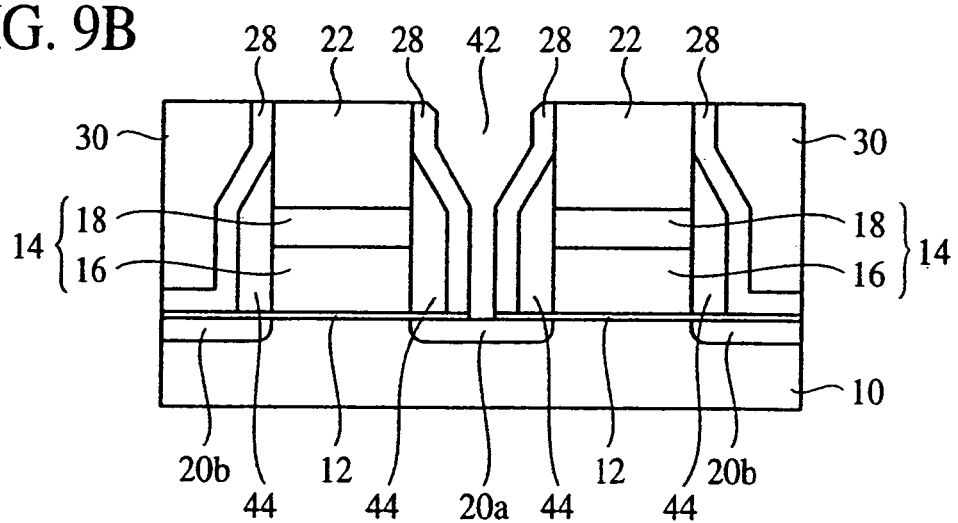

Next, the contact hole 42 is formed by lithography and etching in the inter-layer insulation film 30 down to the source/drain diffused layer 20a by self-alignment with the gate electrode 14 and the barrier insulation film 28 (FIG. 9B). At this time, the gap is larger in the upper end of the sidewall insulation film than at the bottom, which easily admits an etching gas in the gap of the sidewall insulation film and facilitates opening the contact hole 42.

Figure 9C:
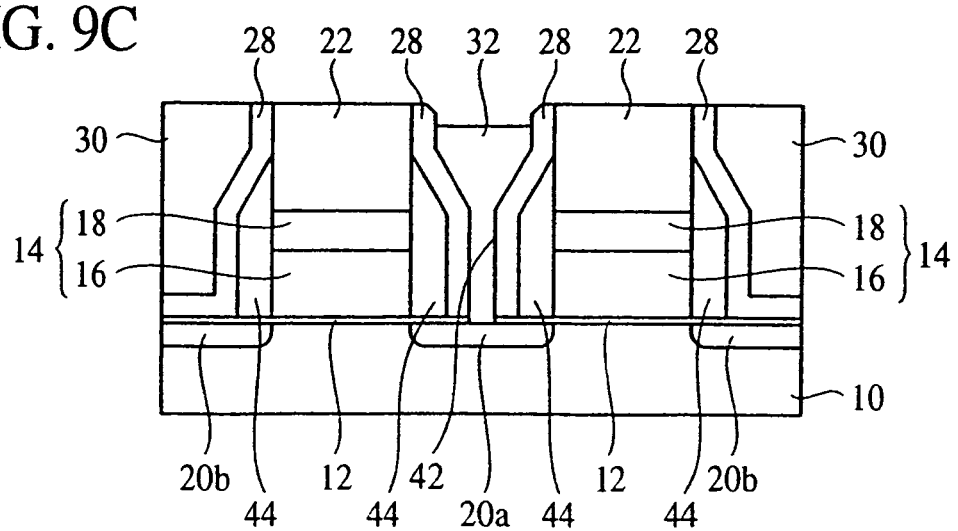

Then, in the same way as in the first embodiment, the plug 32 of amorphous silicon is buried (FIG. 9C). Then, the inter-layer insulation films 34a, 34b and interconnection layers, such as a bit line 36, etc. electrically connected to the plug 32 are formed. Thus, the semiconductor device according to the present embodiment, which has the configuration shown in FIG. 6 is fabricated.

As described above, according to the present embodiment, a film thickness of a lower region of the sidewall insulation film covering the side walls of the gate electrode 14 and the cap insulation film 22 is thickened by the lower spacer insulation film 44 selectively at a lower region, whereby a parasitic capacitance generated between the gate electrode 14 and the plug 32 can be low. The lower spacer insulation film 44 is formed of silicon oxynitride film, whose dielectric constant is lower than that of silicon nitride film, whereby the parasitic capacitance can be further low.

The gap of the sidewall insulation film is larger on the side of the cap insulation film 22 than on the side of the gate electrode 14, which facilitates formation of the contact hole 42 for the plug 32 to be formed in. A margin for connecting the upper interconnection layers, such as the bit line, etc. can be large. The sidewall insulation film has a decreased thickness on the side of the cap insulation film 22, whereby a contact resistance can be low. A width of the gap between adjacent sidewall insulation film is larger on the side of the cap insulation film 22 than on the side of the gate electrode 14, which facilitates forming the contact hole 42 for the plug 32 to be buried in and allows for a large margin for the connection to the upper interconnection layers, such as the bit line, etc. The sidewall insulation film has a decreased thickness on the side of the cap insulation film 22, whereby a contact resistance can be low.

(Modifications)

The present invention is not limited to the above-described embodiments and can cover other various modifications.

For example, in the above-described embodiments, the barrier insulation film 28 is formed after the lower spacer insulation film 26 or the lower spacer insulation film 44 has been formed, but the barrier insulation film 28 in the contact hole 42 may be selectively removed before the plug 32 is formed in the contact hole 42. The barrier insulation film 28 is used as a stopper in opening the contact hole 42, and, for the fabrication steps, may be removed after the contact hole 42 has been opened.

Figure 10:
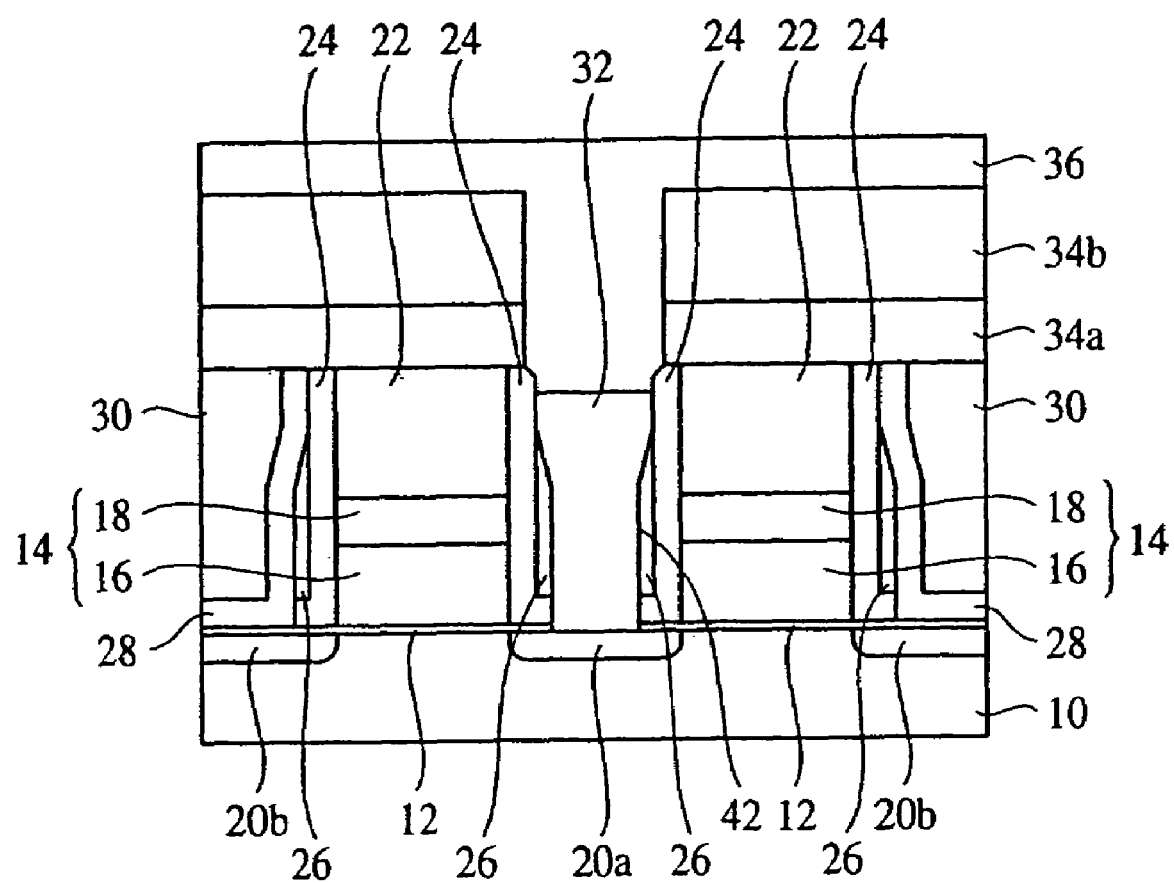
FIG. 10 is a diagrammatic sectional view of the semiconductor device according to the present invention, which includes no barrier insulation film.

The semiconductor device according to the first embodiment which has the barrier insulation film 28 in the contact hole 42 removed has the section configuration as exemplified in FIG. 10. As shown, the contact hole 42 can have a larger diameter by removing the barrier insulation film 28, whereby resistance value of the plug 32 itself, and contact resistance with respect to the bit line 36 and the source/drain diffused layer 20a can be much decreased.

In the above-described embodiments, the gate electrodes 14 have the so-called polymetal structure having the amorphous silicon film 16 and the tungsten film 18 laid one on the other. For removing damages caused by patterning the gate electrodes 14, often a selective oxide film is formed on the side wall of the amorphous silicon film 16. The present invention is applicable to semiconductor devices having the gate electrodes of such structure.

Figure 11:
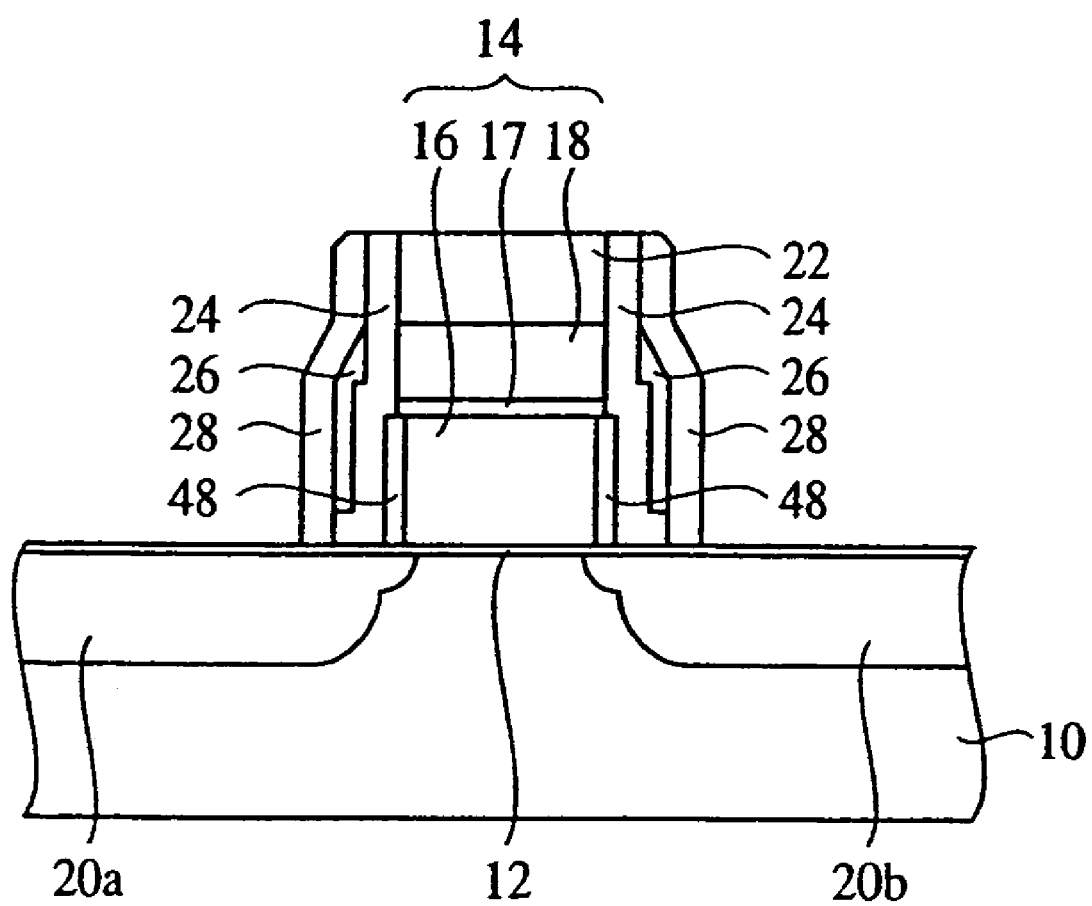
FIG. 11 is a diagrammatic sectional view of the semiconductor device according to a modification of the embodiments of the present invention, which show a configuration thereof.
Figure 12A:
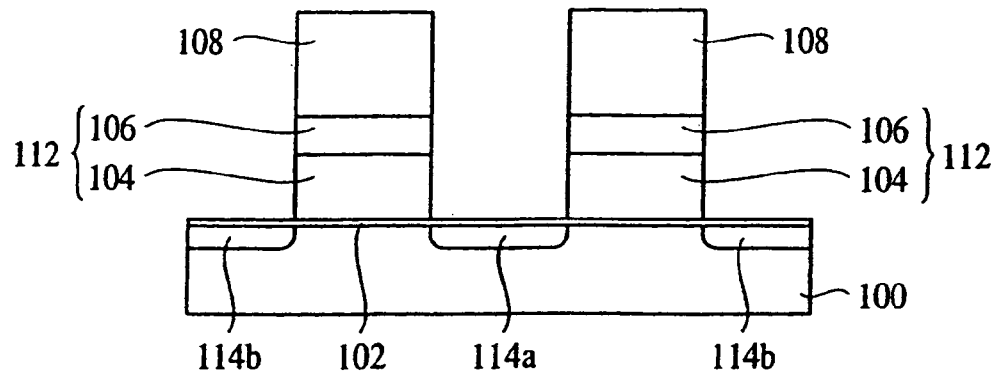
FIGS. 12A–12C are sectional views of the conventional DRAM in the steps of a method for fabricating the DRAM up to forming a bit contact (Part 1).
Figure 12B:
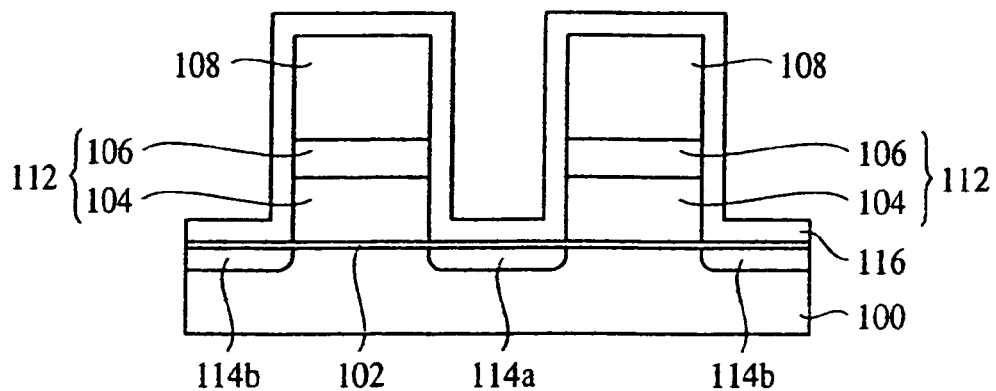
Figure 12C:
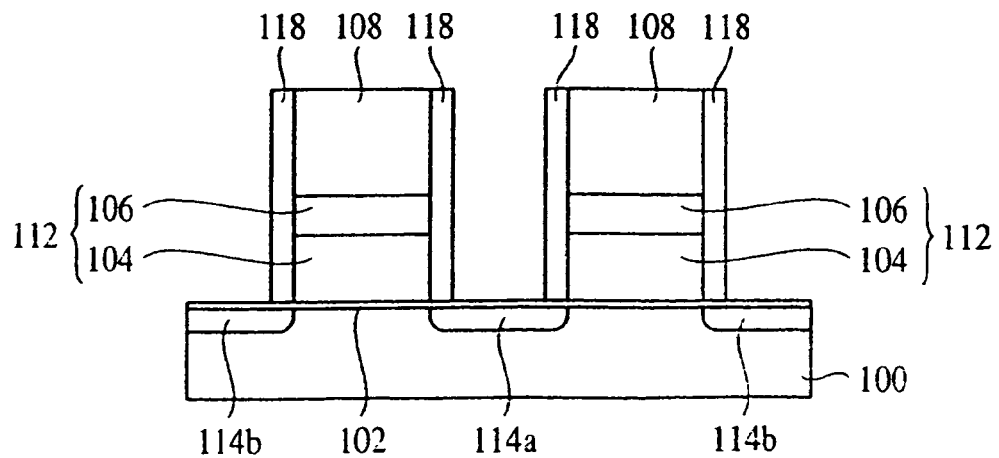
Figure 13A:
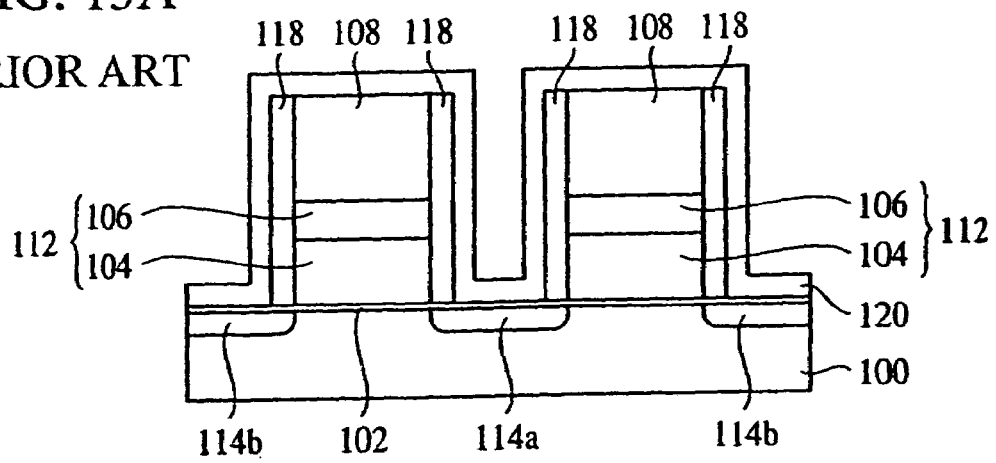
FIGS. 13A–13C are sectional views of the conventional DRAM in the steps of a method for fabricating the DRAM up to forming a bit contact (Part 2).
Figure 13B:
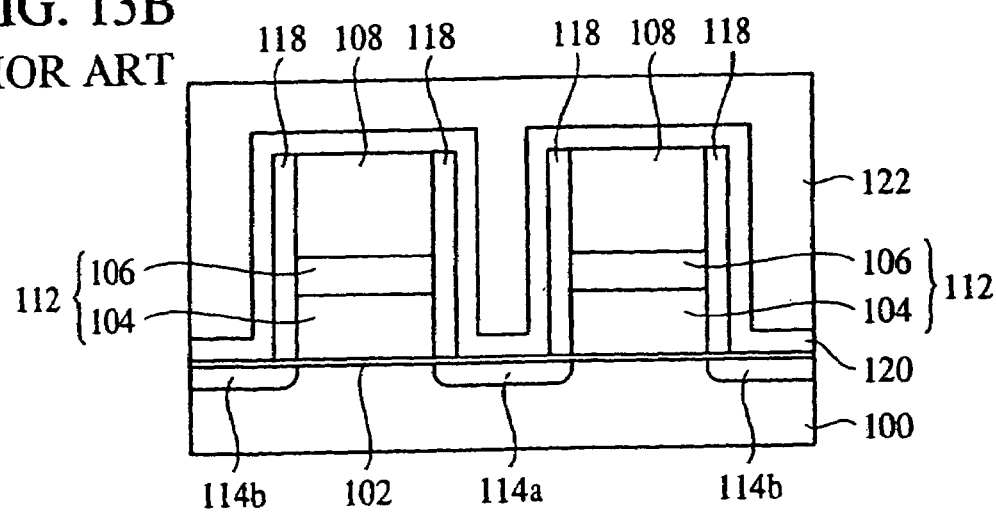
Figure 13C:
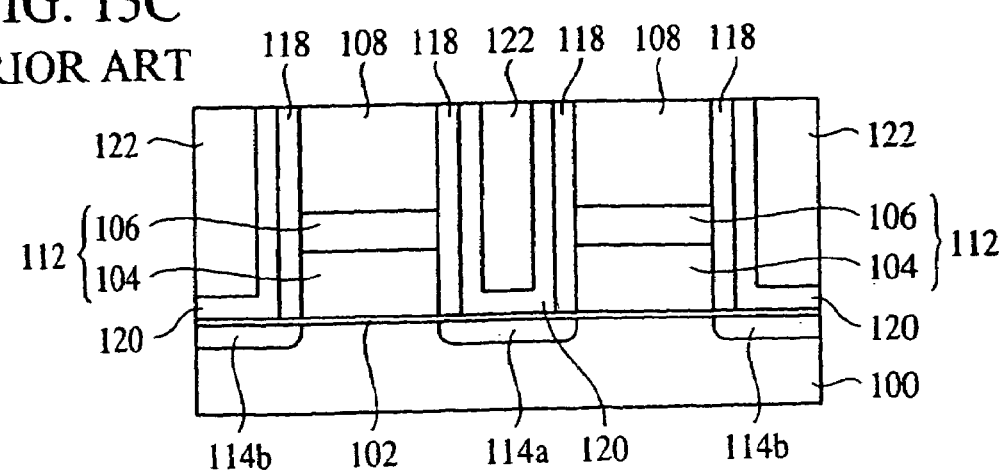
Figure 14A:
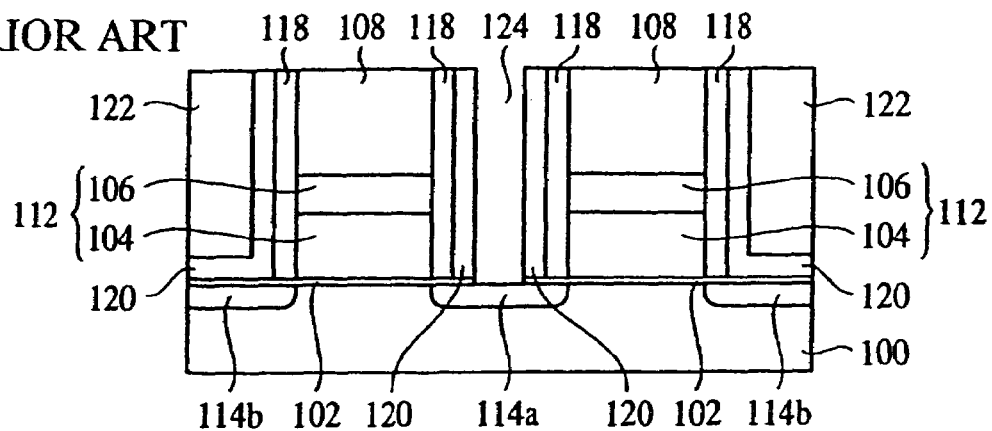
FIGS. 14A–14C are sectional views of the conventional DRAM in the steps of a method for fabricating the DRAM up to forming a bit contact (Part 3).
Figure 14B:
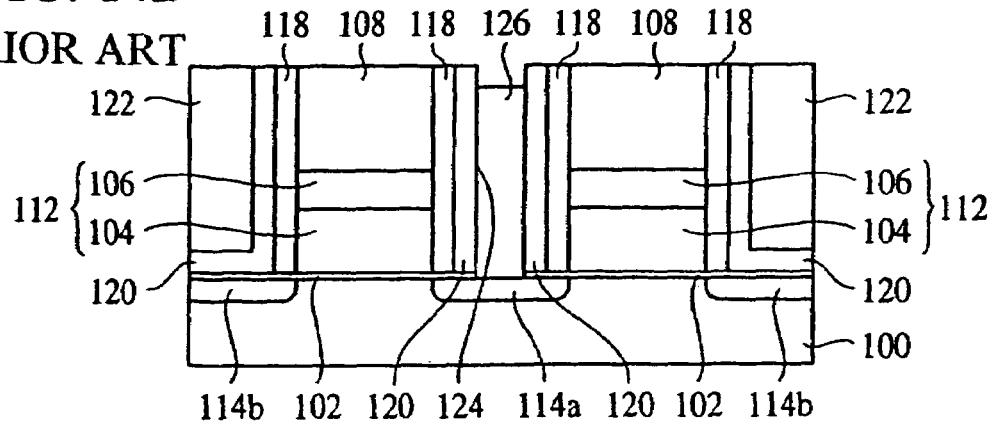
Figure 14C:
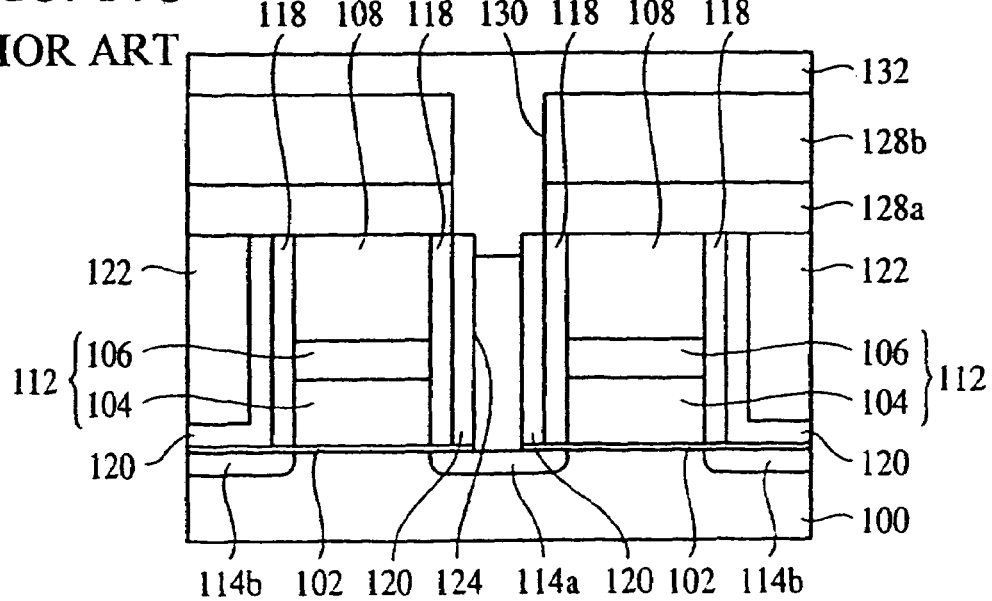
Figure 15:
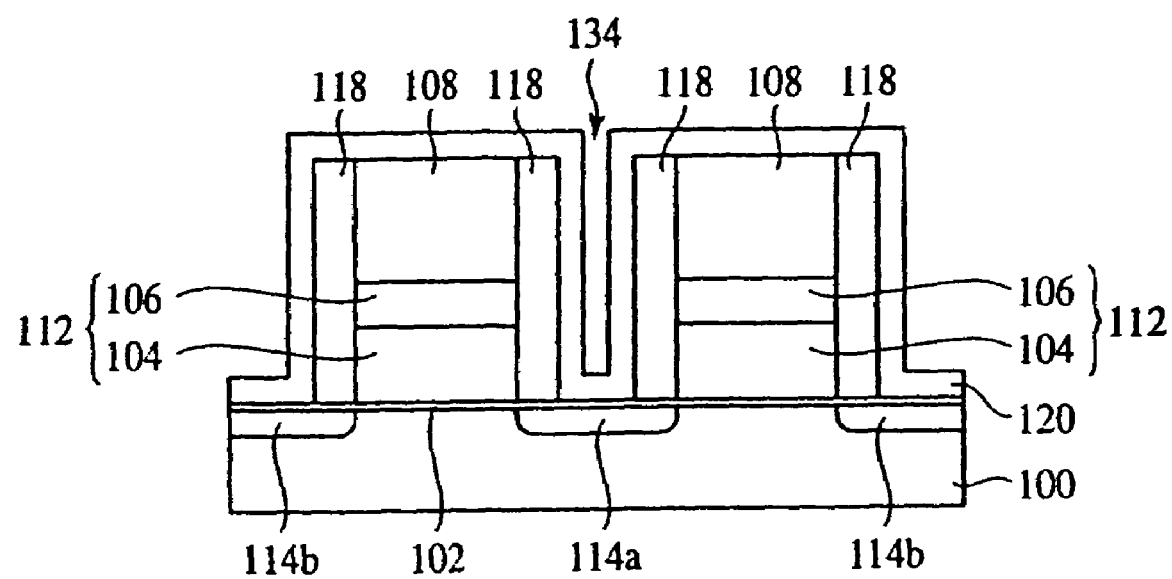
FIG. 15 is a diagrammatic sectional view of the conventional DRAM, which shows the thickening of the sidewall insulation film of the gate electrode interconnection.

For example, as shown in FIG. 11, it is possible that a gate electrode 14 is formed of a layer film of an amorphous silicon film 16, a tungsten nitride film 17 as a barrier metal layer, and a tungsten film 18, and has a silicon oxide film 48 selectively formed on the side wall of the amorphous silicon film 16, and the sidewall insulation film may be formed of a spacer insulation film 24, a lower spacer insulation film 26 and a barrier insulation film 28. The sidewall insulation film may have the configurations of the other embodiments.

The present invention is applicable to not only semiconductor devices including gate electrodes of the polymetal structure, but also to semiconductor devices including gate electrodes of single layer structures of polycrystal silicon film and to semiconductor devices including gate electrodes of polycide structures of polycrystal silicon film and silicide film.

In the above-described embodiments, configurations of the sidewall insulation film of the present invention, and methods for forming such sidewall insulation films have been described, but the present invention is applicable widely to opening by self-alignment contact holes with insulation films formed on upper surfaces and side walls of interconnection layers. Accordingly, in forming not only gate electrodes but also contact holes by self-alignment with bit lines other interconnection layers, the present invention is applicable to configurations of sidewall insulation films to be formed on the side walls of these interconnection layers, and methods for forming the configurations.

What is claimed is:

1. A method for fabricating a semiconductor device comprising the steps of:
    forming above a substrate an interconnection layer having an upper surface covered by a cap insulation film;
    forming a first insulation film on the substrate with the cap insulation film and the interconnection layer formed on;
    forming a second insulation film whose etching rate is higher than that of the first insulation film on the first insulation film;
    anisotropically etching the second insulation film and the first insulation film to leave the first insulation film selectively on side walls of the interconnection layer and the cap insulation film and leave the second insulation film selectively on a lower region of a side wall of the first insulation film;
    forming a third insulation film on an upper region of the side wall of the first insulation film and a side wall of the second insulation film;
    forming a fourth insulation film on the substrate with the interconnection layer and the first, second and third sidewall insulation films, the fourth insulation film contacting to the third sidewall insulation film; and
    anisotropically etching the fourth insulation film and the third insulation film with the cap insulation film and the first to the third insulation films as a stopper to form a contact hole down to the substrate in the fourth insulation film and the third insulation film.

2. A method for fabricating a semiconductor device according to claim 1, further comprising the step of:
    removing the third insulation film in the contact hole after the step of forming a contact hole.

3. A method for fabricating a semiconductor device comprising the steps of:
    forming above a substrate an interconnection layer having a side surface;
    forming a first sidewall insulation film to cover the side surface of the interconnection layer;
    forming a second sidewall insulation film whose etching rate is different from that of the first sidewall insulation film and covering the side surface of the interconnection layer through the first sidewall insulation film;
    forming a third sidewall insulation film whose etching rate is the same as that of the first sidewall insulation film and covering the side surface of the interconnection layer through the first and second sidewall insulation films;
    forming a fourth insulation film on the substrate with the interconnection layer and the first, second and third sidewall insulation films, the fourth insulation film contacting to the third sidewall insulation film; and
    anisotropically etching the fourth insulation film with the third sidewall insulation film as a stopper to form a contact hole down to the substrate in the fourth insulation film.

* * * * *